United States Patent [19]
Geib

[11] Patent Number: 5,333,121
[45] Date of Patent: Jul. 26, 1994

[54] DYNAMIC SEMICONDUCTOR MEMORY HAVING LOCAL READ AMPLIFIER DRIVER CIRCUITS WHICH ARE OPTIMIZED WITH RESPECT TO THEIR DRIVE FUNCTION

[75] Inventor: Heribert Geib, Grafing, Fed. Rep. of Germany

[73] Assignee: Siemens Aktiengesellschaft, Munich, Fed. Rep. of Germany

[21] Appl. No.: 984,579

[22] PCT Filed: Sep. 2, 1991

[86] PCT No.: PCT/DE91/00695
§ 371 Date: Mar. 9, 1993
§ 102(e) Date: Mar. 9, 1993

[87] PCT Pub. No.: WO92/05557
PCT Pub. Date: Apr. 2, 1992

[30] Foreign Application Priority Data
Sep. 20, 1990 [DE] Fed. Rep. of Germany ....... 4029856

[51] Int. Cl.⁵ .............................................. G11C 7/00
[52] U.S. Cl. .................................. 365/205; 365/204; 365/189.01
[58] Field of Search ............... 365/205, 207, 206, 208, 365/204, 203, 189.01

[56] References Cited
U.S. PATENT DOCUMENTS

| | | | |
|---|---|---|---|
| 4,050,061 | 9/1977 | Kitagawa | 340/173 |
| 4,543,501 | 9/1985 | McAlexander, III et al. | 365/205 |
| 4,694,205 | 9/1987 | Shu et al. | 365/203 |
| 4,796,234 | 1/1989 | Itoh et al. | 365/227 |
| 4,943,949 | 7/1990 | Yamaguchi et al. | 365/206 |
| 5,222,038 | 6/1993 | Tsuchida et al. | 365/204 |

FOREIGN PATENT DOCUMENTS

0184031 6/1986 European Pat. Off. .
4001340 7/1990 Fed. Rep. of Germany .
2232516 12/1990 United Kingdom .

OTHER PUBLICATIONS

"Column Address Controlled Sense Amplifier Latching Circuit for DRAM" IBM Technical Disclosure bulletin, vol. 32, No. 2, Jul. 1989, pp. 277–280.

"A 65ns CMOS DRAM with a Twisted Driveline Sense Amplifier" by Shimohigashi et al, IEEE International Solid State Circuits Conference, Feb. 25, 1987, New York, pp. 18, 19, 318, 319.

"Decoded-Source Sense Amplifier for High-Density DRAM's", by Okamura et al, IEEE Journal of Solid-State Circuits, Feb. 25, 1990, No. 1, New York, pp. 18–22.

"An Experimental 16Mb DRAM with Reduced Peak-Current Noise" by Chin et al, 1989 Symposium on VLSI Circuits Digest of Technical Papers, pp. 113–114.

Primary Examiner—Eugene R. LaRoche
Assistant Examiner—Vu Le
Attorney, Agent, or Firm—Hill, Steadman & Simpson

[57] ABSTRACT

The dynamic semiconductor memory which has at least one block of memory (WLB), in which s block of memory has in each case a plurality of bit line blocks (TB, TB' ...) which has for each bit line block a local SAN driver (LTN), and possibly also a local SAP driver (LTP) for driving the read amplifiers (LV) belonging to this bit line block (TB), in order to avoid interfering voltage drops on long driver lines, and which has, to achieve an optimized drive function, multi-stage local SAN drivers (LTN) or SAP drivers (LTP) whose transistors generally have different channel widths.

40 Claims, 3 Drawing Sheets

DYNAMIC SEMICONDUCTOR MEMORY HAVING LOCAL READ AMPLIFIER DRIVER CIRCUITS WHICH ARE OPTIMIZED WITH RESPECT TO THEIR DRIVE FUNCTION

BACKGROUND OF THE INVENTION

The invention relates to a dynamic semiconductor memory.

A dynamic semiconductor memory of this type is known from the publication entitled "An Experimental 16 Megabit DRAM with Reduced Peak-Current Noise" by B. Chin (Samsung) from the Digest of Technical Papers from the 1989 Symposium on VLSI Circuits (pages 113 and 114). This relates to a dynamic semiconductor memory having lines which are interconnected in a block manner to metal conductors lying above ( metal strapping ) in order to reduce the line resistance, and which has distributed SAN and SAP drivers, consisting of a transistor, in each case one SAN driver transistor and one SAP driver transistor being present for each read amplifier. Since two additional transistors are thus required for each read amplifier, this entails a relatively high additional space requirement.

SUMMARY OF THE INVENTION

The object of the invention is to disclose a dynamic semiconductor memory of the type mentioned at the beginning which permits an optimum combination of evaluation reliability and short access time with a minimum chip space requirement. This object is achieved according to the invention by a dynamic semiconductor memory having a memory cell arrangement which has at least one word line block. Read amplifiers have in each case an n-channel part and a p-channel part. At least one SAN driver per word line block drives the n-channel parts of the read amplifiers and at least one SAP driver per word line block drives the p-channel parts of the read amplifiers. At least one word line block has a multiplicity of bit line blocks. The bit line blocks in turn have a multiplicity of bit line pairs, wherein, to the extent that word lines are made contact with through the board, the word lines having superimposed conductor tracks which are of low impedance relative to the word lines and which have word line pins, the bit line pairs located in each case between two word line pins of a word line form a bit line block. To the extent that word lines are guided only in a plane of low-impedance material and additional word line drives are provided, the bit line pairs located in each case between two word line drivers of a word line form a bit line block. Wherein a single SAN driver is present for each bit line block, forms a local SAN driver and can be driven such that the voltage at its output decreases in a piecemeal manner, with different gradients, to enable a fast and at the same time reliable reading. Wherein in each case one local SAN driver drives the n-channel parts of all read amplifiers belonging to a bit line block via a local SAN line.

The particular advantage conferred by the invention is that, with the dynamic semiconductor memory designed according to the invention, in comparison with the cited dynamic semiconductor memory from Samsung, no additional space is required by virtue of an n-phase driver which is required only on a block basis with optimized drive function and, for example, the utilization of a gap between read amplifier blocks already formed by through-plated line interconnects.

Further developments of the present invention are as follows.

The local SAN driver belonging to a bit line block is arranged spatially on a semiconductor chip in such a way that it is located between an arrangement of read amplifiers belonging to the bit line block and an arrangement of read amplifiers which belong to the bit line block directly adjacent to the bit line block.

In each case one local SAN driver contains a diode, which is connected to a reference potential on the cathode side and is connected to a first terminal of a first n-channel transistor on the anode side. A second terminal of the first n-channel transistor is connected to a driver output of the local SAN driver and the gate terminal of the first n-channel transistor can be driven by a first control signal. A second n-channel transistor is connected in parallel with the diode and its gate can be driven by a second control signal. A first terminal of a third n-channel transistor is connected to the driver output of the local SAN driver, and a second terminal of the third n-channel transistor is connected to the reference potential, and the gate terminal of the third n-channel transistor can be driven by a third control signal. At least one further n-channel transistor is connected in parallel with the third n-channel transistor. In each case a first terminal of the further n-channel transistor is connected to the driver output of the local SAN driver, and a second terminal of the further n-channel transistor is connected to the reference potential. It is possible for the gate terminal of the further n-channel transistor to be driven by a further control signal. The n-channel transistor of the local SAN drivers can have different channel widths.

In addition to a local SAN driver, a single SAP driver with optimized drive function is present for each bit line block and forms a local SAP driver. In each case one local SAP driver drives the p-channel parts of all read amplifiers belonging to a bit line block via a local SAP line. The local SAP driver belonging to a bit line block is arranged spatially on a semiconductor chip in such a way that it is located between an arrangement of read amplifiers belonging to the bit line block and an arrangement of read amplifiers which belong to the bit line block directly adjacent to the bit line block.

In each case one local SAP driver contains a diode, which is connected to a supply voltage on the anode side and is connected to a first terminal of a first p-channel transistor on the cathode side. A second terminal of the first p-channel transistor is connected to a driver output of the local SAP driver and the gate terminal of the first p-channel transistor can be driven by a first control signal. A second p-channel transistor is connected in parallel with the diode and its gate terminal can be driven by a second control signal. A first terminal of a third p-channel transistor is connected to the driver output of the local SAP driver, and a second terminal of the third p-channel transistor is connected to the supply voltage, and the gate terminal of the third p-channel transistor can be driven by a third control signal. At least one further p-channel transistor is connected in parallel with the third p-channel transistor. In each case a first terminal of the further p-channel transistor is connected to the driver output of the local SAP driver, and a second terminal of the further p-channel transistor is connected to the supply voltage. It is possible for the gate terminal of the further p-channel transistor to be driven by a further control signal. The p-channel transistors of the local SAP drivers can have different channel widths.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings in the several Figures of which like reference numerals identify like elements, and in which:

The invention is explained below in greater detail with reference to the drawing, in which.

DESCRIPTION OF THE PREFERRED EMBODIMENT

Figure 1:
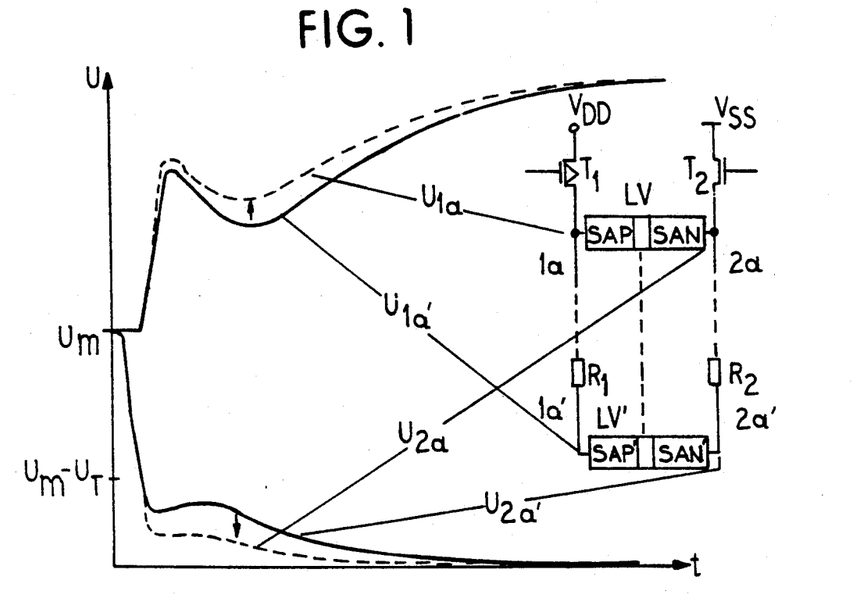
FIG. 1 shows a voltage-time diagram and a basic circuit for explaining the effect of driver line resistances, particularly with global drivers.

FIG. 1 is a voltage-time diagram which shows the voltages $U_{1a}$ and $U_{1a'}$ of a global SAP line $1a$, $1a'$ and the voltages $U_{2a}$, $U_{2a'}$ of a global SAN line $2a$ $2a'$. In this a read amplifier LV consisting of an n-channel part SAN and a p-channel part SAP is located in the immediate vicinity of the p-channel driver transistor $T_1$ and of the n-channel transistor $T_2$. The SAP line section $1a$ next to the driver connects the source terminal of the transistor $T_1$ to the p-channel part SAP of the read amplifier LV, and the SAN line section $2a$ next to the driver connects the drain terminal of the driver transistor $T_2$ to the n-channel part SAN of the read amplifier LV. A read amplifier LV' remote from the driver consists of an n-channel part SAN' and of a p-channel part SAP', the n-channel part SAN' being connected to an SNN line section $2a'$ remote from the driver and the p-channel part SAP' being connected to an SAP line section $1a'$ remote from the driver. A line resistor $R_1$ is located between the SAP line sections next to the driver and remote from the driver, and a line resistor $R_2$ is located between the SAN line sections next to the driver and remote from the driver. The voltage $U_{1a}$ occurring on the SAP line section next to the driver and the voltage $U_{2a}$ occurring on the SAN line section $2a$ next to the driver is represented by a broken line in the voltage-time diagram, and a voltage occurring on the SAP line section $1a'$ remote from the driver and a voltage $U_{2a'}$ occurring on the SAN line section $2a'$ remote from the driver are represented by a solid line. The drain terminal of the p-channel driver transistor $T_1$ is connected to the supply voltage VDD, and the source terminal of the n-channel driver transistor $T_2$ is connected to reference potential $V_{SS}$, and the wiring of the gate terminals of both transistors is not illustrated in more detail. As time progresses, the voltage values $U_{1a}$ and $U_{1a'}$ of the SAP line move from a precharge level $U_m$ in the direction of the supply voltage VDD and during this time the voltages $U_{2a}$ and $U_{2a'}$ move from the precharge voltage level $U_m$ in the direction of the reference potential $V_{SS}$, this occurring in each case more quickly in the read amplifier LV next to the driver than in the read amplifier LV' remote from the driver. The different voltage curves of the voltages $U_{1a}$ and $U_{1a'}$ and the voltage curves of $U_{2a}$ and $U_{2a'}$ are caused by a current-dependent negative voltage feedback, as a result of the voltage drop across the resistor $R_1$ and across the resistor $R_2$.

As the length of a SAP or SAN line increases, the electrical resistance $R_1$ and $R_2$ increases and, as a result of the concomitant voltage drop, reduces the control voltage present at the read amplifier LV'. A great disadvantage here is that read amplifiers remote from the driver are driven more poorly than read amplifiers next to the driver, and hence evaluate more slowly and are more susceptible to external interfering influences. Furthermore, no identical, optimized drive function can be specified for all read amplifiers, since the electrical resistance between driver and read amplifier is different and is not negligible in relation to the internal resistance of the driver. If, on the other hand, the driver transistors $T_1$ and $T_2$ are driven so strongly that a read amplifier remote from the driver is sufficiently driven, then there is the danger of incorrect evaluation at the read amplifiers next to the driver as a result of the over-strong driving. In an extreme case, the read amplifier furthest away from the driver is to evaluate a logical zero and the other read amplifiers are to evaluate a logical one in each case. In this case, the read amplifiers which are to evaluate a logical one are activated before the read amplifier which is to evaluate a logical zero, as a result of which, for example, a discharge current flows via the SAN line and the driver transistor $T_2$ to the reference potential Vss and produces a voltage drop on the SAN line. The read amplifier which is to evaluate the logical zero will only commence the evaluation when the control voltage $U = U_m - U_T$ ($U_m$=precharge voltage and $U_T$=threshold voltage) is reached. If, for example, the current-dependent negative voltage feedback is high as a result of the resistance $R_2$ of the SAN line $2a$, $2a'$, then it may take a relatively long time before this control voltage level is reached.

Figure 2:
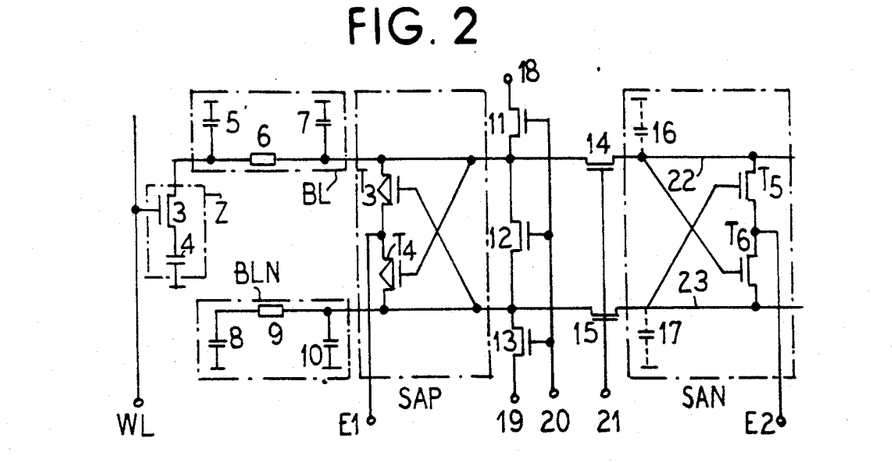
FIG. 2 shows a detailed circuit of a read amplifier with coupled memory cell and bit line equivalent circuit.

FIG. 2 shows a possible detailed circuit of a read amplifier which is coupled to a memory cell Z via a bit line BL and which is connected to a complementary bit line BLN. The memory cell Z consists of an n-channel MOS transistor 3, the source terminal of which is connected via a cell capacitor 4 to reference potential, the drain terminal of which is connected to the bit line BL, and the gate of which is connected to the word line WL. The bit line BL is represented by a Pi equivalent circuit comprising two parallel capacitors 5 and 7 and a series resistor 6. The complementary bit line BLN is represented in an analogous manner by two parallel capacitors 8 and 10 and a series resistor 9. The bit line BL and the complementary bit line BLN are connected to the p-channel part SAP of a read amplifier consisting of two cross-coupled coupled p-channel transistors $T_3$ and $T_4$, the drain terminal of the transistor $T_3$ and the gate terminal of the transistor $T_4$ being connected to the bit line BL, the drain terminal of the transistor $T_4$ and the gate terminal of the transistor $T_3$ being connected to the complementary bit line BLN, and the source terminal of the transistor $T_3$ being connected together with the source terminal of the transistor $T_4$ to an SAP input E1. The bit line BL can be short-circuited with the complementary bit line BLN by means of a transistor 12, the bit line can be precharged to a voltage present at the input 18 by the transistor 11, and the complementary bit line BLN can be charged to a precharge voltage present at the input 19 by the transistor 13. The gates of the transistors 11 to 13 can be driven jointly via an input 20. Two transfer transistors 14 and 15 connect the bit line pair BL and BLN of the p-channel part SAP to bit line sections 22 and 23 of the n-channel part SAN of the read amplifier, and the gates of the transistors 14 and 15 can be jointly driven via an input 21. The n-channel part SAN of the read amplifier has two cross-coupled n-channel transistors $T_5$ and $T_6$, the bit line section 22 connected to the transistor 14 being connected to the drain terminal of the transistor $T_5$ and to the gate of the transistor $T_6$, the bit line section 23 connected to the transfer transistor 15 being connected to the drain of the transistor $T_6$ and to the gate of the transistor $T_5$, and the source terminals of transistors $T_5$ and $T_6$ being connected to an SAN input E2. The bit line section 22 has a capacitor 16 and the bit line section 23 has a capacitor 17 with respect to reference potential.

Despite a memory cell Z at a high potential, the bit line BL, together with the bit line section 22, can be discharged more quickly as a result of component dissymmetries than the complementary bit line BLN together with the associated complementary bit line section 23. If, for example, the capacitance formed by the capacitors 7 and 16 is less than the capacitance formed by the capacitors 10 and 17, or if the current gain of the transistor $T_4$ or that of the transistor $T_5$ is greater than the gain of the transistor $T_3$ or of the transistor $T_5$, then the bit line BL together with the bit line section 22 can erroneously be discharged more quickly than the complementary bit liner BLN with the associated bit line section 23, because as too quick a rise of the voltage from SAP input E1 or too quick a drop of the voltage at the SAN input E2 occurs. This gives rise to the requirement for an optimized drive function for the inputs E1 and E2. A voltage driving of the SAP input E1 and of the SAN input E2 is required in order that the optimized drive function is largely the same for all read amplifiers. A voltage control can be achieved approximately with local SAN drivers and SAP drivers.

Figure 3:
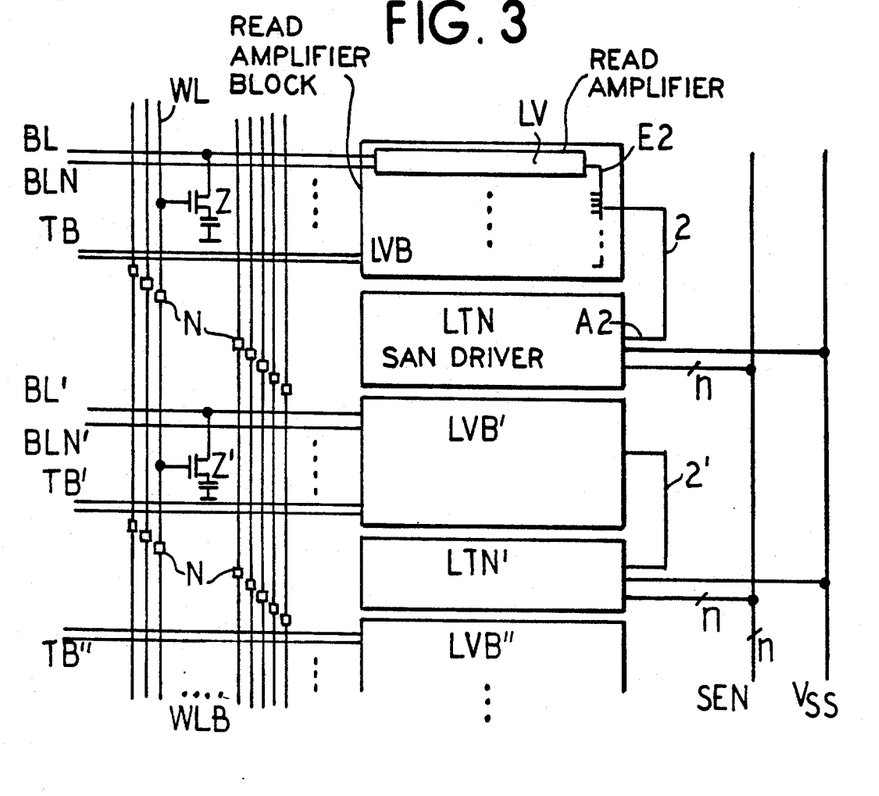
FIG. 3 shows a representation of the arrangement in blocks of local SAN drivers in a dynamic semiconductor memory according to the invention.

FIG. 3 shows an arrangement in blocks of local SAN drivers LTN, LTN' . . . , in each case between read amplifiers LVB, LVB', LVB" . . . in a dynamic semiconductor memory according to the invention. A read amplifier block LVB consists of a plurality of read amplifiers, which are connected, for example, like a read amplifier LV to a bit line pair BL and BLN and can be driven in each case via an SAN input E2. In this case, the SAN inputs E2 of the read amplifiers belonging to the read amplifier block LVB, such as the read amplifier LV for example, are connected via a local SAN line to an SAN driver output A2. The local SAN driver LTN is driven in an n-phase manner via n drive lines SEN and is connected to reference potential Vss. The read amplifiers LVB, LVB', LVB" . . . are assigned to bit line blocks TB, TB', TB" . . . , the bit line block TB comprising a multiplicity of bit line pairs, such as the bit line pair BL and BLN for example, and the bit line block TB' comprising a multiplicity of bit line pairs, such as the bit line pair BL' and BLN' for example. FIG. 3 shows, to represent a plurality of word line blocks, a word line block WLB which consists of word lines WL interconnected by word line pins N. Representing an entire cell field, memory cells Z with a bit line BL and a word line WL and also a memory cell Z' with a bit line BL' and the word line WL are shown.

If a bit line block TB' favorably corresponds to the number of all bit line pairs between two interconnect pins N of a word line WL, then it is possible in each case for exactly one gap between the read amplifier blocks LVB, LVB', LVB' . . . produced by the interconnect pins N to be used for local SAN drivers LTN, LTN' . . . . Interconnect points for the word line pins N are considerably wider than the word line and are arranged in a staggered manner to minimize the word line spacing, which results in a sufficient gap between the read amplifier blocks. Instead of a global SAN line, which is connected to 1024 read amplifiers for example, in a dynamic semiconductor memory according to the invention, for instance, an arrangement with 16 local SAN drivers LTN, LTN' . . . and 16 local SAN lines 2, 2' . . . , which are connected in each case to 64 read amplifiers LV, is used. In this example, the line resistances of the local SAN line are reduced in relation to a global SAN line by a factor of 16, and are thus largely negligible in relation to the internal resistance of the respective local SAN driver. As a result of the substantially lower line resistances of the local SAN lines, a current-dependent negative voltage feedback is also negligible, and all read amplifiers LV of a read amplifier block receive largely the same drive voltage at their SAP inputs E2. This is a prerequisite for the use of an SAN driver with optimized drive function.

If the word lines WL are, for instance, laid in only one plane of a low-resistance material, that is to say no interconnect pins N are used, then the word lines must be shorter and additional word line drivers are necessary. The gaps formed by the additional word line drivers between read amplifier blocks may be advantageously used for local SAN or SAP drivers.

Figure 4:
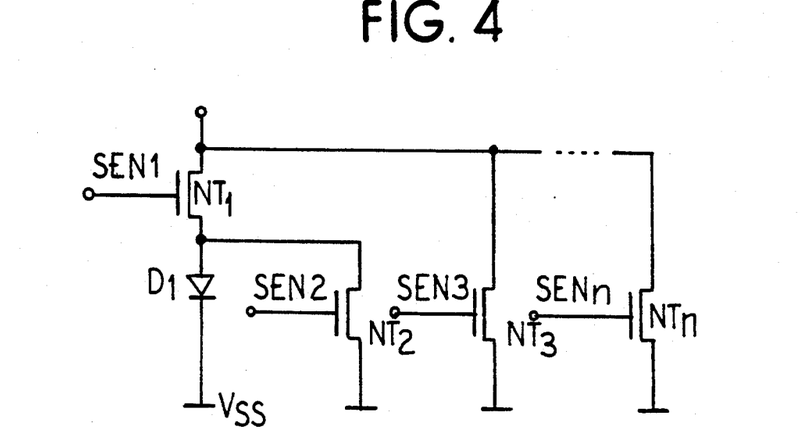
FIG. 4 shows a detailed circuit of an n-phase local SAN driver of a dynamic semiconductor memory according to the invention.

FIG. 4 represents a detailed circuit of an n-phase local SAN driver of a dynamic semiconductor memory according to the invention. The local SAN driver circuit has a minimum of three and a maximum of n n-channel transistors, which can be driven in the case of the minimum by three drive lines SEN1 to SEN3, and in the case of the maximum via n drive lines SEN1 to SENn. The drain terminal of an n-channel transistor $NT_1$ is connected to an SAN driver output A2, the source terminal is connected via a forward-biased diode $D_1$ to reference potential $V_{SS}$, and the gate of the n-channel transistor $NT_1$ is connected to the drive line SEN1. A further n-channel transistor $NT_2$ is connected in parallel with the diode $D_1$ and is connected to a drive line SEN2. Located between the SAN driver output A2 and the reference potential $V_{SS}$ is a third n-channel transistor $NT_3$, which can be driven by a third drive line SEN3. For better approximation of an optimum drive function, further n-channel transistors up to a transistor $NT_n$, the gate of which is connected to a drive line SENn, can be connected in parallel with the transistor $NT_3$. It is of less importance here whether the drive lines SEN1 . . . SENn can be formed outside the local SAN driver or whether they can be formed in the local SAN drivers from, for example, the signal of the drive line SEN1, by delay circuits in each case.

The diode $D_1$ is a bipolar diode realized with CMOS process steps, which is also used at other points of a dynamic semiconductor memory according to the invention, and must be dimensioned with respect to its current strength in such a way that the junction capacitors connected to the SAN line and the line capacitor can be discharged within a reasonable time. By dimensioning the individual transistors and selecting the time of driving, the control voltage can be shaped bit by bit, first of all flat and then dropping sharply.

Figure 5:
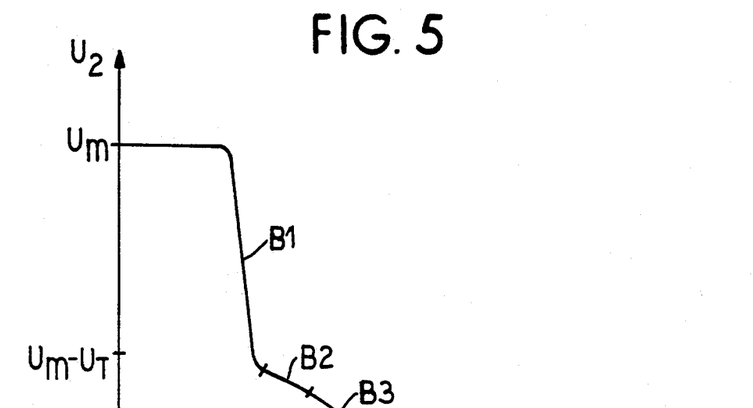
FIG. 5 shows a voltage-time diagram for explaining the n-phase local SAN driver of FIG. 4.

The bit-by-bit formation of an optimized drive function by the local n-phase SAN drivers shown in FIG. 4 is represented in the voltage-time diagram of FIG. 5. The voltage-time diagram shows the voltage $U_2$ at the SAN driver output A2, provided that the latter is connected via a local SAN line to read amplifiers. If all drive lines SEN1 . . . SENn are at low potential, then the voltage $U_2$ corresponds to the precharge level $U_m$, but as soon as the transistor $NT_1$ becomes conductive in a first phase B1, the output voltage $U_2$ drops to a value $U_m - U_T$ reduced by the threshold voltage $U_T$ of an n-channel read approximately to the threshold voltage of the diode D1. The actual evaluation begins with the second phase B2 in which the channel resistor of the transistor $NT_1$ is connected in series with the transistor $NT_2$. As a result of the further connection of the transistors $NT_3$ to $NT_n$, the internal resistance of the SAN driver is specifically reduced step-by-step, which causes the output voltage $U_2$ to drop to the reference potential in accordance with an optimized drive function.

Figure 6:
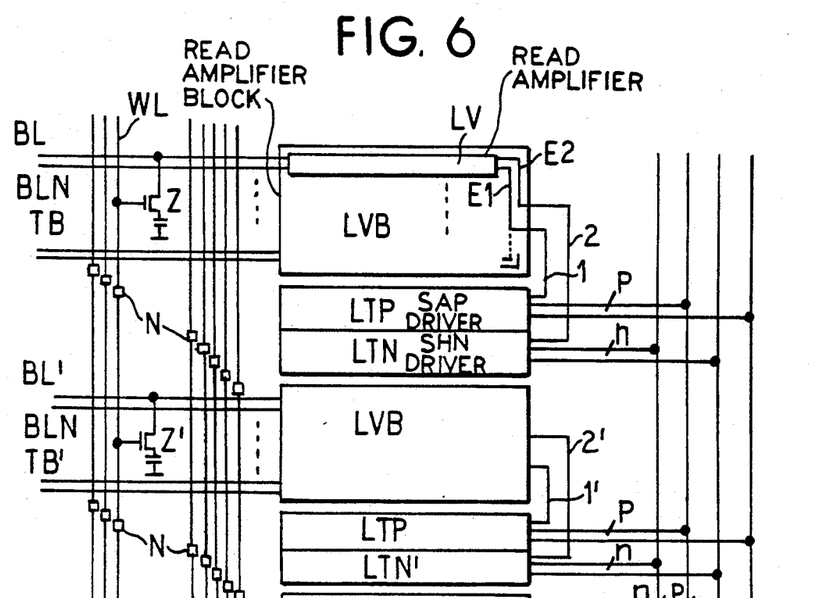
FIG. 6 shows a representation for the arrangement in blocks of local SAN and SAP drivers in a dynamic semiconductor memory according to the invention.

The representation of FIG. 6 shows an arrangement of local SAN and SAP drivers in blocks in a dynamic semiconductor memory according to the invention. In a similar manner to FIG. 4, FIG. 6 represents read amplifier blocks LVB, LVB', LVB" . . . with their associated bit line blocks TB, TB', TB" . . . A word line block WLB likewise consists of word lines WL interconnected with word line pins N, which is connected, in a manner representing all memory cells of a word line block, to a memory cell Z and a memory cell Z'. The read amplifier block LVB consists of a multiplicity of read amplifiers, such as the read amplifier LV for example, which are connected to bit line pairs, such as the bit line pair BL and BLN for example. The read amplifier LV compares the bit line BL, which is connected to the memory cell Z, with the bit line BLN. And in an analogous manner, the bit line BL', which is connected to the cell Z', is compared with the bit line BLN' in the read amplifier block LVB'. The essential difference to FIG. 4 are the local p-phase SAP drivers LTP which are present in addition to the local n-phase SAN drivers and can be driven in each case by p-drive lines SEP. The SAN input E2 of a read amplifier LV of a read amplifier block LVB is connected via a local SAN line 2 to the SAN output A2 of the local SAN driver LTN. In a similar manner, the SAP input E1 of a read amplifier LV of a read amplifier block LVB is connected via a local SAP line 1 to an SAP output A1 of the local SAP driver LTP. This applies analogously to further read amplifier blocks, such as the read amplifier block LVB' for example, which is connected via the local SAP driver line 1' and the local SAN driver line 2' to the local SAP driver LTP' and to the local SAN driver LTN'.

In a manner similar to the local SAN drivers, the local SAP drivers LTP, LTP' . . . make it possible to achieve an optimized drive function for the p-channel parts of the read amplifiers. Owing to the lower majority carrier mobility of the p-channel driver transistors, local SAP drivers take up approximately three times as much space as corresponding local SAN drivers. The detailed circuit shown in FIG. 7 of an n-phase local SAP driver in a dynamic semiconductor memory according to the invention has a similar structure to the local SAN driver represented in FIG. 4. The local SAP driver has a p-channel transistor $PT_1$, the drain terminal of which is connected to an SAP driver output A1, the source terminal of which is connected via a forward-biased diode $D_2$ to the supply voltage $V_{DD}$, and the gate of which is connected to a control line SEP1. A p-channel transistor $PT_2$ is connected in parallel with the diode $D_2$ and the gate of the transistor $PT_2$ is connected to a drive line SEP2. Located between the SAP driver output A1 and the supply voltage $V_{DD}$ is a p-channel transistor $PT_3$, the gate of which can be driven via a drive line SEP3. For better approximation of an optimum drive function, further p-channel transistors up to a transistor $PT_p$, the gate of which is connected to the drive line $SEP_p$, can be connected in parallel with the transistor $PT_3$. In a similar way as for the SAN driver, described in FIG. 4, the signals for the further drive lines SEP2 . . . SEPn can also be formed for the SAP driver from, for example, the signal of the drive line SEP1 by delay circuits.

Figure 7:
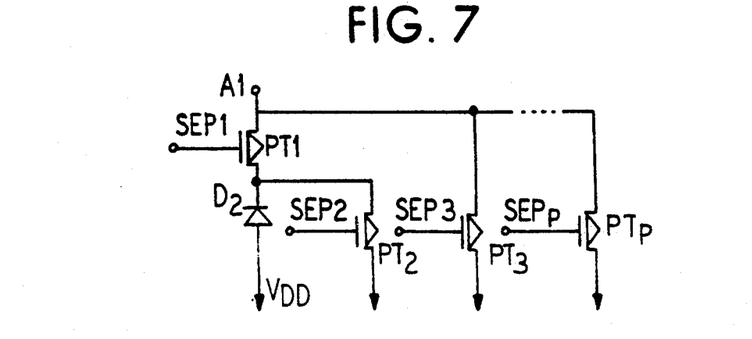
FIG. 7 shows a detailed circuit of an n-phase Local SAP driver in a dynamic semiconductor memory according to the invention.

In a first phase, in which the drive line SEP1 receives low potential, the transistor $PT_1$ becomes conductive and the voltage at the SAP driver output A1 rises from a precharge voltage $U_m$ to a voltage which is lower than the supply voltage $V_{DD}$ only by the threshold voltage of the diode $D_2$. If the transistor $PT_2$ becomes conductive in a second phase, in which the drive line SEP2 receives low potential, then a series circuit of the channel resistances of the transistors $PT_1$ and $PT_2$ is produced. In a third to $p^{th}$ phase, the transistors $PT_3$ to $PT_p$ become successively conductive by low potential on the control lines SEP3 to $SEP_p$, and hence the internal resistance of the SAP driver is reduced step by step, the voltage at the SAP driver output A1 being brought to the supply voltage $V_{DD}$ in accordance with an optimized drive function.

A combination of MOS transistors and bipolar transistors is conceivable both for the SAN driver and for the SAP driver. The MOS transistors cannot be completely replaced by bipolar transistors since, due to the threshold voltages occurring with bipolar transistors, a reduction to $V_{SS}$ or a rise to $V_{DD}$ is not possible.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A dynamic semiconductor memory, comprising:
   a memory cell array which has at least one block of memory cells connected to a group of word lines;
   read amplifiers, each having an n-channel part and a p-channel part;
   at least one SAN driver per block of memory cells connected to a group of word lines for driving the n-channel parts of the read amplifiers;

at least one SAP driver per block of memory cells connected to a group of word lines for driving the p-channel parts of the read amplifiers;

at least one block of memory cells connected to a group of word lines which is subdivided into a plurality of memory blocks, each memory block connected to a group of bit lines, said memory blocks connected to a group of bit lines in turn having a plurality of bit line pairs;

said word lines having an electrical contact with superimposed conductor tracks which are of low impedance relative to the word lines via word line pins, the bit line pairs respectively located between two respective word line pins of a word line forming a memory block connected to a group of bit lines;

a single SAN driver for each memory block connected to a respective group of bit lines, forming a local SAN driver and being driven such that a voltage at its output decreases in a piecemeal manner, with different gradients, to enable a fast and at the same time reliable reading; and one local SAN driver driving the n-channel parts of all read amplifiers belonging to a memory block via a local SAN line.

2. The dynamic semiconductor memory as claimed in claim 1, wherein a local SAN driver belonging to a first memory block connected to a first group of bit lines is arranged spatially on a semiconductor chip such that said local SAN driver is located between an array of read amplifiers belonging to the first memory block and an array of read amplifiers which belong to a further memory block connected to a further group of bit lines and directly adjacent to the first memory block.

3. The dynamic semiconductor memory as claimed in claim 1, wherein each of the local SAN drivers contains a diode, which is connected to a reference potential on a cathode side thereof and is connected to a first terminal of a first n-channel transistor on an anode side thereof, wherein a second terminal of the first n-channel transistor is connected to a driver output of the associated local SAN driver and a gate terminal of the first n-channel transistor is driven by a first control signal, wherein a second n-channel transistor is connected in parallel with the diode and has a gate terminal that is driven by a second control signal, and wherein a first terminal of a third n-channel transistor is connected to the driver output of the associated local SAN driver, and wherein a second terminal of the third n-channel transistor is connected to the reference potential, and a gate terminal of the third n-channel transistor is driven by a third control signal.

4. The dynamic semiconductor memory as claimed in claim 3, wherein at least one further n-channel transistor is connected in parallel with the third n-channel transistor, a first terminal of the further n-channel transistor being connected to the driver output of the associated local SAN driver, and a second terminal of the further n-channel transistor being connected to the reference potential, and wherein a gate terminal of the further n-channel transistor is driven by a further control signal.

5. The dynamic semiconductor memory as claimed in claim 3, wherein n-channel transistors of the local SAN drivers have different channel widths.

6. The dynamic semiconductor memory as claimed in claim 1, wherein in addition to a local SAN driver, a respective SAP driver with optimized drive function is connected to each respective memory block and forms a local SAP driver, and wherein one local SAP driver drives the p-channel parts of all read amplifiers belonging to a respective memory block via a local SAP line.

7. The dynamic semiconductor memory as claimed in claim 6, wherein a local SAP driver belonging to a first memory block connected to a first group of bit lines is arranged spatially on a semiconductor chip such that said local SAP driver is located between an array of read amplifiers belonging to the first memory block and an array of read amplifiers which belong to a further memory block connected to a further group of bit lines and directly adjacent to the first memory block.

8. The dynamic semiconductor memory as claimed in claim 6, wherein each of the local SAP drivers contains a diode, which is connected to a supply voltage on an anode side thereof and is connected to a first terminal of a first p-channel transistor on a cathode side thereof, wherein a second terminal of the first p-channel transistor is connected to a driver output of the associated local SAP driver and a gate terminal of the first p-channel transistor is driven by a first control signal, wherein a second p-channel transistor is connected in parallel with the diode and has a gate terminal that is driven by a second control signal, and wherein a first terminal of a third p-channel transistor is connected to the driver output of the associated local SAP driver, and a second terminal of the third p-channel transistor is connected to the supply voltage, and a gate terminal of the third p-channel transistor is driven by a third control signal.

9. The dynamic semiconductor memory as claimed in claim 8, wherein at least one further p-channel transistor is connected in parallel with the third p-channel transistor, a first terminal of the further p-channel transistor being connected to the driver output of the local SAP driver, and a second terminal of the further p-channel transistor being connected to the supply voltage, and wherein a gate terminal of the further p-channel transistor is driven by a further control signal.

10. The dynamic semiconductor memory as claimed in claim 8, wherein p-channel transistors of the local SAP drivers have different channel widths.

11. The dynamic semiconductor memory as claimed in claim 4, wherein n-channel transistors of the local SAN drivers have different channel widths.

12. The dynamic semiconductor memory as claimed in claim 9, wherein p-channel transistors of the local SAP drivers have different channel widths.

13. A dynamic semiconductor memory, comprising:
a memory cell array which has at least one block of memory cells connected to a group of word lines;
read amplifiers, each having an n-channel part and a p-channel part;
at least one SAN driver per block of memory cells connected to a group of word lines for driving the n-channel parts of the read amplifiers;
at least one SAP driver per block of memory cells connected to a group of word lines for driving the p-channel parts of the read amplifiers;
at least one block of memory cells connected to a group of word lines which is subdivided into a plurality of memory blocks, each memory block connected to a group of bit lines, said memory blocks connected to a group of bit lines in turn having a plurality of bit lines pairs;
said word lines being only in a plane of low-impedance material with additional word line drivers, the bit line pairs respectively located between two respective word line drivers of a word line forming a memory block connected to a group of bit lines;

a single SAN driver for each memory block, forming a local SAN driver and being driven such that a voltage at its output decreases in a piecemeal manner, with different gradients, to enable a fast and at the same time reliable reading; and one local SAN driver driving the n-channel parts of all read amplifiers belonging to a memory block via a local SAN line.

14. The dynamic semiconductor memory as claimed in claim 13, wherein a local SAN driver belonging to a first memory block connected to a first group of bit lines is arranged spatially on a semiconductor chip such that said local SAN driver is located between an array of read amplifiers belonging to the first memory block and an array of read amplifiers which belong to a further memory block connected to a further group of bit lines and directly adjacent to the first memory block.

15. The dynamic semiconductor memory as claimed in claim 13, wherein each of the local SAN drivers contains a diode, which is connected to a reference potential on a cathode side thereof and is connected to a first terminal of a first n-channel transistor on an anode side thereof, wherein a second terminal of the first n-channel transistor is connected to a driver output of the associated local SAN driver and a gate terminal of the first n-channel transistor is driven by a first control signal, wherein a second n-channel transistor is connected in parallel with the diode and has a gate terminal that is driven by a second control signal, and wherein a first terminal of a third n-channel transistor is connected to the driver output of the associated local SAN driver, and wherein a second terminal of the third n-channel transistor is connected to the reference potential, and a gate terminal of the third n-channel transistor is driven by a third control signal.

16. The dynamic semiconductor memory as claimed in claim 15, wherein at least one further n-channel transistor is connected in parallel with the third n-channel transistor, a first terminal of the further n-channel transistor being connected to the driver output of the associated local SAN driver, and a second terminal of the further n-channel transistor being connected to the reference potential, and wherein a gate terminal of the further n-channel transistor is driven by a further control signal.

17. The dynamic semiconductor memory as claimed in claim 15, wherein n-channel transistors of the local SAN drivers have different channel widths.

18. The dynamic semiconductor memory as claimed in claim 13, wherein, in addition to a local SAN driver, a respective SAP driver with optimized drive function is connected to each respective memory block and forms a local SAP driver, and wherein one local SAP driver drives the p-channel parts of all read amplifiers belonging to a respective memory block via a local SAP line.

19. The dynamic semiconductor memory as claimed in claim 18, wherein a local SAP driver belonging to a first memory block connected to a first group of bit lines is arranged spatially on a semiconductor chip such that said local SAP driver is located between an array of read amplifiers belonging to the first memory block and an array of read amplifiers belong to a further memory block connected to a further group of bit lines and directly adjacent to the first memory block.

20. The dynamic semiconductor memory as claimed in claim 18, wherein each of the local SAP drivers contains a diode, which is connected to a supply voltage on an anode side thereof and is connected to a first terminal of a first p-channel transistor on a cathode side thereof, wherein a second terminal of the first p-channel transistor is connected to a driver output of the associated local SAP driver and a gate terminal of the first p-channel transistor is driven by a first control signal, wherein a second p-channel transistor is connected in parallel with the diode and has a gate terminal that is driven by a second control signal, and wherein a first terminal of a third p-channel transistor is connected to the driver output of the associated local SAP driver, and a second terminal of the third p-channel transistor is connected to the supply voltage, and a gate terminal of the third p-channel transistor is driven by a third control signal.

21. The dynamic semiconductor memory as claimed in claim 20, wherein at least one further p-channel transistor is connected in parallel with the third p-channel transistor, a first terminal of the further p-channel transistor being connected to the driver output of the local SAP driver, and a second terminal of the further p-channel transistor being connected to the supply voltage, and wherein a gate terminal of the further p-channel transistor is driven by a further control signal.

22. The dynamic semiconductor memory as claimed in claim 20, wherein p-channel transistors of the local SAP drivers have different channel widths.

23. The dynamic semiconductor memory as claimed in claim 16, wherein n-channel transistors of the local SAN drivers have different channel widths.

24. The dynamic semiconductor memory as claimed in claim 21, wherein p-channel transistors of the local SAP drivers have different channel widths.

25. A dynamic semiconductor memory, comprising:
a memory cell array which has at least one block of memory cells connected to a group of word lines;
read amplifiers, each having an n-channel part and a p-channel part;
at least one SAN driver per block of memory cells connected to a group of word lines for driving the n-channel parts of the read amplifiers;
at least one SAP driver per block of memory cells connected to a group of word lines for driving the p-channel parts of the read amplifiers;
at least one block of memory cells connected to a group of word lines which is subdivided into a plurality of memory blocks, each memory block connected to a group of bit lines, said memory blocks connected to a group of bit lines in turn having a plurality of bit lines pairs;
said word lines being only in a plane of low-impedance material with additional word line drivers, the bit line pairs respectively located between two respective word line drivers of a word line forming a memory block connected to a group of bit lines;
a single SAN driver for each memory block, forming a local SAN driver and being driven such that a voltage at its output decreases in a piecemeal manner with different gradients, to enable a fast and at the same time reliable reading;
one local SAN driver driving the n-channel parts of all read amplifiers belonging to a memory block via a local SAN line; and
each of the local SAN drivers having a diode, which is connected to a reference potential on a cathode side thereof and is connected to a first terminal of a first n-channel transistor on an anode side thereof, a second terminal of the first n-channel transistor connected to a driver output of the associated local SAN driver and a gate terminal of the first n-channel transistor driven by a first control signal, a second n-channel transistor connected in parallel with the diode and having a gate terminal that is driven by a second control signal, a first terminal of a third n-channel transistor connected to the driver output of the associated local SAN driver, and a second terminal of the third n-channel transistor connected to the reference potential, and a gate terminal of the third n-channel transistor driven by a third control signal.

26. The dynamic semiconductor memory as claimed in claim 25, wherein at least one further n-channel transistor is connected in parallel with the third n-channel transistor, a first terminal of the further n-channel transistor being connected to the driver output of the associated local SAN driver, and a second terminal of the further n-channel transistor being connected to the reference potential, and wherein a gate terminal of the further n-channel transistor is driven by a fruther control signal.

27. The dynamic semiconductor memory as claimed in claim 25, wherein n-channel transistors of the local SAN drivers have different channel widths.

28. The dynamic semiconductor memory as claimed in claim 25, wherein, in addition to a local SAN driver, a respective SAP driver with optimized drive function is connected to each respective memory block and forms a local SAP driver, wherein one local SAP driver drives the p-channel parts of all read amplifiers belonging to a respective memory block via a local SAP line; and wherein each of the local SAP drivers contains a diode, which is connected to a supply voltage on an anode side thereof and is connected to a first terminal of a first p-channel transistor on a cathode side thereof, a second terminal of the first p-channel transistor being connected to a driver output of the associated local SAP driver and a gate terminal of the first p-channel transistor driven by a first control signal, a second p-channel transistor being connected in parallel with the diode and having a gate terminal that is driven by a second control signal, a first terminal of a third p-channel transistor being connected to the driver output of the associated local SAP driver, and a second terminal of the third p-channel transistor being connected to the supply voltage, and a gate terminal of the third p-channel transistor being driven by a third control signal.

29. The dynamic semiconductor memory as claimed in claim 28, wherein at least one further p-channel transistor is connected in parallel with the third p-channel transistor, a first terminal of the further p-channel transistor being connected to the driver output of the local SAP driver, and a second terminal of the further p-channel transistor being connected to the supply voltage, and wherein a gate terminal of the further p-channel transistor is driven by a further control signal.

30. The dynamic semiconductor memory as claimed in claim 28, wherein p-channel transistors of the local SAP drivers have different channel widths.

31. The dynamic semiconductor memory as claimed in claim 26, wherein n-channel transistors of the local SAN drivers have different channel widths.

32. The dynamic semiconductor memory as claimed in claim 29, wherein p-channel transistors of the local SAP drivers have different channel widths.

33. A dynamic semiconductor memory, comprising:
a memory cell array which has at least one block of memory cells connected to a group of word lines;
read amplifiers, each having an n-channel part and a p-channel part;
at least one SAN driver per block of memory cells connected to a group of word lines for driving the n-channel parts of the read amplifiers;
at least one SAP driver per block of memory cells connected to a group of word lines for driving the p-channel parts of the read amplifiers;
at least one block of memory cells connected to a group of word lines which is subdivided into a plurality of memory blocks, each memory block connected to a group of bit lines, said memory blocks connected to a group of bit lines in turn having a plurality of bit lines pairs;
said word lines having an electrical contact with superimposed conductor tracts which are of low impedance relative to the word lines via word line pins, the bit line pairs respectively located between two respective word line pins of a word line forming a memory block;
a single SAN driver for each memory block connected to a respective group of bit lines, forming a local SAN driver and being driven such that a voltage at its output decreases in a piecemeal manner, with different gradients, to enable a fast and at the same time reliable reading;
one local SAN driver driving the n-channel parts of all read amplifiers belonging to a memory block via a local SAN line; and
each of the local SAN drivers having a diode, which is connected to a reference potential on a cathode side thereof and is connected to a first terminal of a first n-channel transistor on an anode side thereof, a second terminal of the first n-channel transistor connected to a driver output of the associated local SAN driver and a gate terminal of the first n-channel transistor driven by a first control signal, a second n-channel transistor connected in parallel with the diode and having a gate terminal driven by a second control signal, a first terminal of a third n-channel transistor connected to the driver output of the associated local SAN driver, and a second terminal of the third n-channel transistor connected to the reference potential, and a gate terminal of the third n-channel transistor driven by a third control signal.

34. The dynamic semiconductor memory as claimed in claim 33, wherein at least one further n-channel transistor is connected in parallel with the third n-channel transistor, a first terminal of the further n-channel transistor being connected to the driver output of the associated local SAN driver, and a second terminal of the further n-channel transistor being connected to the reference potential, and wherein a gate terminal of the further n-channel transistor is driven by a further control signal.

35. The dynamic semiconductor memory as claimed in claim 33, wherein n-channel transistors of the local SAN drivers have different channel widths.

36. The dynamic semiconductor memory as claimed in claim 33, wherein, in addition to a local SAN driver, a respective SAP driver with optimized drive function is connected to each respective memory block and forms a local SAP driver, wherein one local SAP driver drives the p-channel parts of all read amplifiers belonging to a respective memory block via a local SAP line; and wherein each of the local SAP drivers contains a diode, which is connected to a supply voltage on an anode side thereof and is connected to a first terminal of a first p-channel transistor on a cathode side thereof, a second terminal of the first p-channel transistor being connected to a driver output of the associated local SAP driver and a gate terminal of the first p-channel transistor being driven by a first control signal, a second p-channel transistor being connected in parallel with the diode and having a gate terminal that is driven by a second control signal, a first terminal of a third p-channel transistor being connected to the driver output of the associated local SAP driver, and a second terminal of the third p-channel transistor being connected to the supply voltage, and a gate terminal of the third p-channel transistor being driven by a third control signal.

37. The dynamic semiconductor memory as claimed in claim 36, wherein at least one further p-channel transistor is connected in parallel with the third p-channel transistor, a first terminal of the further p-channel transistor being connected to the driver output of the local SAP driver, and a second terminal of the further p-channel transistor being connected to the supply voltage, and wherein a gate terminal of the further p-channel transistor is driven by a further control signal.

38. The dynamic semiconductor memory as claimed in claim 36, wherein p-channel transistors of the local SAP drivers have different channel widths.

39. The dynamic semiconductor memory as claimed in claim 34, wherein n-channel transistors of the local SAN drivers have different channel widths.

40. The dynamic semiconductor memory as claimed in claim 37, wherein p-channel transistors of the local SAP drivers have different channel widths.

* * * * *